(12) United States Patent
Cho et al.

(10) Patent No.: US 8,767,481 B2
(45) Date of Patent: Jul. 1, 2014

(54) NONVOLATILE MEMORY DEVICE AND METHOD OF OPERATING THE SAME

(71) Applicant: SK hynix Inc., Icheon-si (KR)

(72) Inventors: Myung Cho, Icheon-si (KR); Seong Je Park, Suwon-si (KR); Jung Hwan Lee, Suwon-si (KR); Ji Hwan Kim, Seoul (KR); Beom Seok Hah, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 42 days.

(21) Appl. No.: 13/648,566

(22) Filed: Oct. 10, 2012

(65) Prior Publication Data

US 2013/0088930 A1    Apr. 11, 2013

(30) Foreign Application Priority Data

Oct. 10, 2011    (KR) .................. 10-2011-0102932

(51) Int. Cl.
*G11C 7/10* (2006.01)

(52) U.S. Cl.
USPC ............. 365/189.05; 365/185.12; 365/185.09

(58) Field of Classification Search
USPC ........................ 365/189.05, 185.12, 185.09
See application file for complete search history.

(56) References Cited

U.S. PATENT DOCUMENTS 7,903,467 B2 *  3/2011  Lee .......................... 365/185.22

* cited by examiner

*Primary Examiner* — Huan Hoang
(74) *Attorney, Agent, or Firm* — William Park & Associates Patent Ltd.

(57) ABSTRACT

A nonvolatile memory device includes a page buffer unit configured to include a plurality of page buffers coupled to the respective bit lines; a pass/fail circuit coupled to the page buffer unit and configured to perform a pass/fail check operation by comparing the amount of current, varying according to verify data stored in the plurality of page buffers, with an amount of reference current corresponding to the number of allowed error correction code bits; and a masking circuit configured to preclude the pass/fail check operation by coupling a ground terminal to sense nodes coupled to the remaining page buffers, respectively, other than page buffers corresponding to column addresses having the identical upper bits as an input column address.

22 Claims, 3 Drawing Sheets

NONVOLATILE MEMORY DEVICE AND METHOD OF OPERATING THE SAME

CROSS-REFERENCE TO RELATED APPLICATION

The present application claims priority under 35 U.S.C 119(a) to Korean patent application number 10-2011-0102932 filed on Oct. 10, 2011, the entire disclosure of which is incorporated by reference herein.

BACKGROUND

1. Field of the Invention

An embodiment of this disclosure relates to a nonvolatile memory device and a method of operating the same and, more particularly, to a nonvolatile memory device capable of checking a pass or fail of a memory cell in response to a column address, and a method of operating the same.

2. Description of the Related Art

Recently, demand has increased for nonvolatile memory devices which can be electrically programmed and erased, and which do not require a refresh function for rewriting data at specific intervals.

Each of the memory cells of a nonvolatile memory device is an electrically programmable and erasable element. The program and erase operations of the memory cell are performed in such a way that electrons are moved by a strong electric field supplied to a thin oxide layer of the memory cell, thereby shifting a threshold voltage of the memory cell.

During a program operation of a nonvolatile memory device, a verify operation is performed for checking whether target program cells have been programmed with a verify voltage or a higher voltage. Cells on which a program operation is no longer needed to be performed because the cell passed a verify operation are treated as pass cells. Cells on which a program operation has not been completed are treated as fail cells and are subjected to an additional program operation.

It is necessary to check the number of fail cells within one page in accordance with an operation of a nonvolatile memory device. To this end, a pass/fail circuit outputs a fail signal when the number of fail cells within one page is greater than the number of allowed error correction code (hereinafter referred to as 'ECCs') bits and outputs a pass signal when the number of fail cells within one page is smaller than the allowed number of ECC bits.

When performing a pass/fail check operation using a pass/fail circuit during a program operation, a known nonvolatile memory device classifies a plurality of page buffers by group and sequentially performs the pass/fail check operation by group. In this case, page buffers placed in adjacent regions are grouped into one group.

In the pass/fail check operation using the known pass/fail circuit, however, an operation of checking an address again is necessary in order to determine whether an error can be corrected because the number of fail bits is counted within a page buffer grouped according to page buffer positions. This is because data must be selected based on a column address and then checked within a specific range in order to determine whether an error can be corrected.

BRIEF SUMMARY

An embodiment relates to a nonvolatile memory device and a method of operating the same, wherein a pass/fail check operation is sequentially performed on memory cells based on a column address by discharging a sense node coupled to the remaining page buffers other than a selected page buffer group by using an upper bit of the column address.

A nonvolatile memory device according to an aspect of the present disclosure includes a page buffer unit configured to include a plurality of page buffers coupled to the respective bit lines; a pass/fail circuit coupled to the page buffer unit and configured to perform a pass/fail check operation by comparing the amount of current, varying according to verify data stored in the plurality of page buffers, with an amount of reference current corresponding to the number of allowed error correction code bits; and a masking circuit configured to preclude the pass/fail check operation by coupling a ground terminal to sense nodes coupled to the remaining page buffers, respectively, other than page buffers corresponding to column addresses having identical upper bits as an input column address.

A nonvolatile memory device according to another aspect of the present disclosure includes a memory block configured to include a plurality of memory cells; a page buffer unit configured to include a plurality of page buffers coupled to the respective bit lines of the memory block, to temporarily store verify data by sensing the program state of the memory cells corresponding to the plurality of page buffers, and to control the potential of the sense nodes based on the verify data; a masking circuit configured to sequentially generate sense node-invalid signals in order to define page buffers corresponding to column addresses having identical upper bits and select the page buffers by group; and a pass/fail circuit configured to generate a pass or fail signal by comparing the amount of current flowing through the verify circuits, included in the respective page buffers corresponding to the column addresses having the same upper bits, with the amount of reference current corresponding to the number of allowed error correction code bits.

A method of operating a nonvolatile memory device according to yet another aspect of the present disclosure includes verifying the program state of a plurality of memory cells included in the same pages of a memory block by using a plurality of page buffers corresponding to the plurality of memory cells; controlling the potential of each of sense nodes included in the respective page buffers based on a result of the verification; selecting page buffers corresponding to column addresses having identical upper bits, from among the plurality of page buffers; and generating a pass or fail signal by comparing the amount of current according to a result of the verification of the selected page buffers with the amount of reference current.

DESCRIPTION OF EMBODIMENTS

Hereinafter, embodiments of the present disclosure will be described in detail with reference to the accompanying drawings. The figures are provided to allow those having ordinary skill in the art an understanding of a scope of the embodiments of this disclosure.

Figure 1:
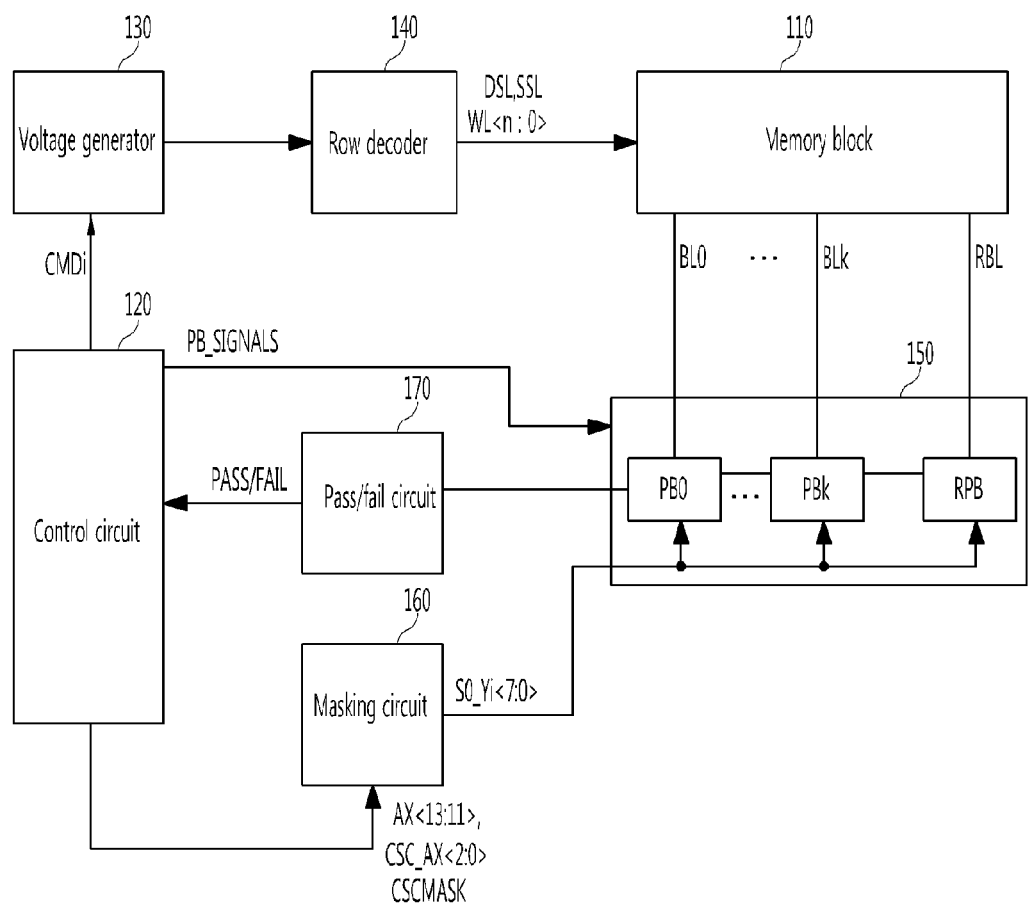
FIG. 1 is a block diagram of a nonvolatile memory device according to an embodiment of this disclosure.

FIG. 1 is a block diagram of a nonvolatile memory device according to an embodiment of this disclosure.

Referring to FIG. 1, the nonvolatile memory device includes a memory block 110 configured to include a plurality of memory cells, operation circuits (130 to 150) configured to perform a program operation, a read operation, and an erase operation for inputting and outputting data of memory cells included in a selected page of the memory block 110. The nonvolatile memory device may also include a masking circuit 160, a pass/fail circuit 170, and a control circuit 120 configured to control the operation circuits (130 to 150) and the masking circuit 160. The operation circuits (130 to 150) include a voltage generator 130, a row decoder 140, and a page buffer unit 150.

The page buffer unit 150 includes a plurality of page buffers PB0 to PBk and RPB. In a pass/fail check operation, a sense node coupled to unselected page buffers is discharged to a low level in response to sense node-invalid signals SO_Yi<7:0>. In contrast, each selected page buffer latches verify data according to the program state of memory cells coupled to the selected page buffer and maintains the potential of the sense node at a high level or shifts the potential of the sense node to a low level based on the verify data. If the program state of the memory cells are determined to be a pass, the verify data of '1' is stored, and the potential of the sense node shifts to a low level. If the program state of the memory cells is determined to be fail, the verify data of '0' is stored and the sense node maintains a high level. The pass/fail check operation of the page buffer will be described later. The sense node-invalid signals SO_Yi<7:0> correspond to the respective column addresses AX<13:0> of a plurality of the page buffers. More specifically, the sense node-invalid signals SO_Yi<7:0> may correspond to respective page buffer groups having the same (identical) upper bits AX<13:11> in the column addresses AX<13:0>.

The masking circuit 160 generates the sense node-invalid signals SO_Yi<7:0> for selecting page buffers having the same upper bits AX<13:11>, from among the column addresses AX<13:0>, in the plurality of page buffers PB0 to PBk and RPB. The masking circuit 160 may generate the sense node-invalid signals SO_Yi<7:0> in response to the upper bits AX<13:11> of the column addresses AX<13:0>, check address signals CSC_AX<2:0>, and a mask signal CSCMASK.

The pass/fail circuit 170 generates a pass or fail signal PASS or FAIL by comparing an amount of measured current, flowing through the verify circuit of each of the page buffers of the page buffer unit 150, with an amount of reference current corresponding to the number of allowed bits that may be processed by an ECC circuit. For example, when the amount of measured current is greater than the amount of reference current, the pass/fail circuit 170 may generate the fail signal FAIL. When the amount of measured current is smaller than the amount of reference current, the pass/fail circuit 170 may generate the pass signal PASS.

Figure 2:
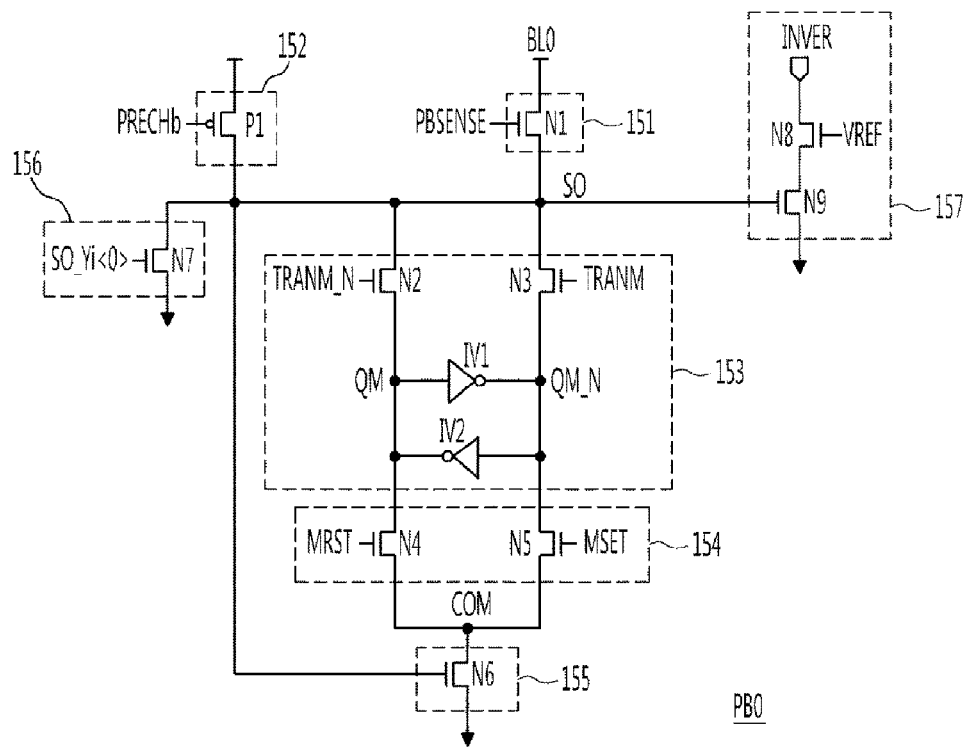
FIG. 2 is a detailed circuit diagram of a page buffer among a plurality of page buffers shown in FIG. 1.

FIG. 2 is a detailed circuit diagram of one (for example, PB0) of the page buffers shown in FIG. 1.

Referring to FIG. 2, the page buffer PB0 includes a bit line coupling circuit 151, a precharge circuit 152, a latch circuit 153, a data input circuit 154, a sense circuit 155, a discharge circuit 156, and a verify circuit 157.

The bit line coupling circuit 151 is coupled between a bit line BL0 and a sense node SO and is configured to couple the bit line BL0 and the sense node SO in response to a coupling signal PBSENSE. The bit line coupling circuit 151 may include an NMOS transistor N1.

The precharge circuit 152 is coupled between a power source terminal and the sense node SO and is configured to precharge the sense node SO to a power source voltage in response to a precharge signal PRECHb. The precharge circuit 152 may include a PMOS transistor P1.

The latch circuit 153 is coupled to the sense node SO and is configured to shift the potential of the sense node SO to a high level or a low level based on data latched in the page buffer PB0. The latch circuit 153 includes inverters IV1 and IV2 coupled in parallel in opposite directions between a first node QM and a second node QM_N, an NMOS transistor N2 coupled between the first node QM and the sense node SO, and an NMOS transistor N3 coupled between the second node QM_N and the sense node SO. The NMOS transistor N2 is turned on in response to a first transfer signal TRANM_N, and the NMOS transistor N3 is turned on in response to a second transfer signal TRANM.

The data input circuit 154 is coupled between a common node COM and the first node QM and the second node QM_N of the latch circuit 153. The data input circuit 154 is configured to input data to the latch circuit 153 according to a potential of the common node COM, where the data is inputted in response to a first or second input signal MRST and MSET. The data input circuit 154 includes NMOS transistor N4 and N5. The NMOS transistor N4 is coupled between the first node QM and the common node COM, and the NMOS transistor N4 is turned on in response to the first input signal MRST. The NMOS transistor N5 is coupled between the second node QM_N and the common node COM, and the NMOS transistor N5 is turned on in response to the second input signal MSET.

The sense circuit 155 is coupled between the common node COM and a ground terminal and the sense circuit 155 is turned on or off in response to a potential of the sense node SO, thus controlling the potential of the common node COM. The sense circuit 155 may include an NMOS transistor N6.

The discharge circuit 156 is coupled between the sense node SO and the ground terminal. The discharge circuit 156 is configured to discharge the potential of the sense node SO in response to the sense node-invalid signals SO_Yi<7:0> received from the masking circuit 160. The discharge circuit 156 may include an NMOS transistor N7.

The verify circuit 157 is coupled between a verify terminal INVER and the ground terminal. The verify circuit 157 is configured to form a current path flowing from the verify terminal INVER to the ground terminal based on the potential of the sense node SO and a reference voltage VREF, where the reference voltage VREF is enabled to a high level in a pass/fail check operation.

The verify circuit 157 includes NMOS transistors N8 and N9 coupled between the verify terminal INVER and the ground terminal. The NMOS transistor N8 is turned on in response to the reference voltage VREF, and the NMOS transistor N9 is turned on in response to the reference voltage VREF and a potential of the sense node SO. Accordingly, in a pass/fail check operation, a path of current flowing from the verify terminal INVER to the ground terminal is formed according to a potential of the sense node SO.

Figure 3:
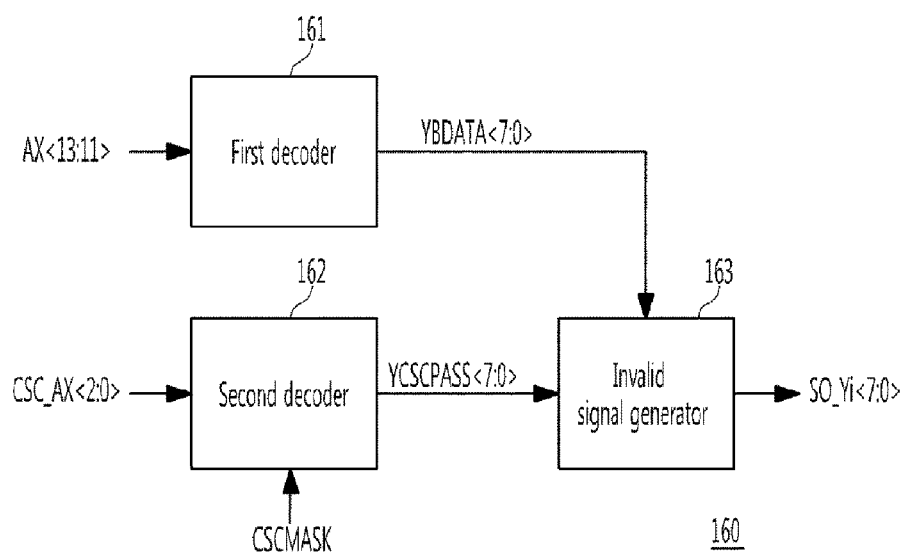
FIG. 3 is a detailed block diagram of a masking circuit shown in FIG. 1.

FIG. 3 is a detailed block diagram of the masking circuit 160 shown in FIG. 1.

Referring to FIG. 3, the masking circuit 160 includes first and second decoders 161 and 162 and an invalid signal generator 163.

The first decoder 161 outputs first decoding signals YBDATA<7:0> by decoding the upper bits AX<13:11> of the column addresses AX<13:0>.

The second decoder 162 outputs second decoding signals YCSCPASS<7:0> by decoding the check address signals CSC_AX<2:0> in response to the mask signal CSCMASK.

The invalid signal generator 163 outputs the sense node-invalid signals SO_Yi<7:0> in response to the first decoding signals YBDATA<7:0> and the second decoding signals YCSCPASS<7:0>.

The number of upper bits AX<13:11> is identical with the number of check address signals CSC_AX<2:0>.

In an embodiment of this disclosure, the number of sense node-invalid signals SO_Yi<7:0> is illustrated as being 8, but the number of sense node-invalid signals may be changed depending on the number of memory cells grouped in a page of the memory block 110 in a pass/fail check operation. For example, if one page is defined as a groups, a plurality of sense node-invalid signals SO_Yi<15:0> may be generated by using the upper bit column addresses AX<13:10> and the check address signals CSC_AX<3:0>.

Figure 4:
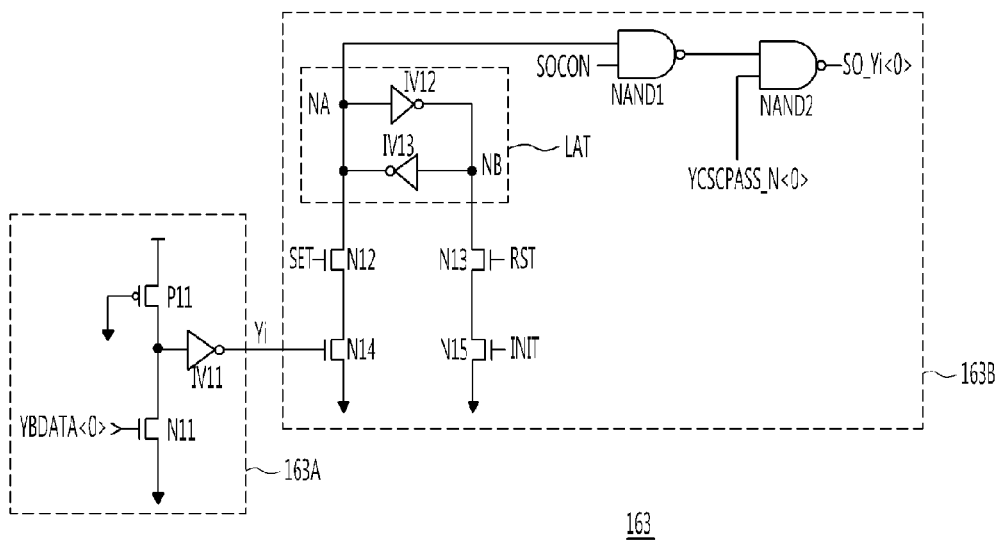
FIG. 4 is a detailed circuit diagram of a discharge signal generator shown in FIG. 3.

FIG. 4 is a detailed circuit diagram of the invalid signal generator 163 shown in FIG. 3.

The invalid signal generator 163 includes a plurality of signal generators for generating the respective sense node-invalid signals SO_Yi<7:0>.

The plurality of signal generators may be designed to have a similar structure, and thus only one of the signal generators is described as an example.

Referring to FIG. 4, the signal generators include a control circuit 163A and a determination circuit 163B.

The control circuit 163A generates a control signal Yi in response to the first decoding signal YBDATA<0>.

The control circuit 163A includes a PMOS transistor P11, an NMOS transistor N11, and an inverter IV11.

The PMOS transistor P11 and the NMOS transistor N11 are coupled in series between the power source terminal and the ground terminal. The gate of the PMOS transistor P11 is coupled to the ground terminal. The NMOS transistor N11 is turned on or off in response to the first decoding signal YBDATA<0>. The inverter IV11 is coupled to a node between the PMOS transistor P11 and the NMOS transistor N11, and the inverter IV11 is configured to output the control signal Yi.

That is, the control circuit 163A outputs the control signal Yi of a high level in response to the first decoding signal YBDATA<0> of a high level.

The determination circuit 163B temporarily stores data corresponding to the control signal Yi and generates the sense node-invalid signals SO_Yi<0> in response to the temporarily stored data and the second decoding signal YCSCPASS<0>.

The determination circuit 163B includes a latch LAT, a plurality of NMOS transistors N12 to N15, and NAND gates NAND1 and NAND2.

The latch LAT includes inverters IV12 and IV13 coupled in parallel in opposite directions between a first node NA and a second node NB.

The NMOS transistors N12 and N14 are coupled in series between the first node NA of the latch LAT and the ground terminal and are turned on in response to a set signal SET and the control signal Yi, respectively. The NMOS transistors N13 and N15 are coupled in series between the second node NB of the latch LAT and the ground terminal and are turned on in response to a reset signal RST and an initial signal INIT, respectively. That is, in an initialization operation, the second node NB of the latch LAT is reset to a low level in response to the reset signal RST of a high level and the initial signal INIT. In a setting operation subsequent to the initialization operation, data stored in the latch LAT is determined in response to the set signal SET of a high level and the control signal Yi. That is, when the control signal Yi is at a high level, the potential of the first node NA shifts to a low level. When the control signal Yi is at a low level, the potential of the first node NA maintains a high level and thus temporarily stores data.

The NAND gate NAND1 generates a logic signal in response to an output control signal SOCON and the potential of the first node NA of the latch LAT. For example, when the potential of the first node NA is at a low level, the NAND gate NAND1 outputs a logic signal of a high level in response to the output control signal SOCON shifting from a low level to a high level.

The NAND gate NAND2 generates the sense node-invalid signals SO_Yi<0> in response to the logic signal of the NAND gate NAND1 and the second decoding signal YCSCPASS<0>. For example, when the logic signal of the NAND gate NAND1 is at a high level, the NAND gate NAND2 generates the sense node-invalid signals SO_Yi<0> of a low level.

Referring to FIGS. 3 and 4, the masking circuit 160 generates the first decoding signals YBDATA<7:0> by decoding the upper bits AX<13:11> of the column addresses AX<13:0> and the masking circuit 160 outputs only one of the sense node-invalid signals SO_Yi<7:0> as a low level in order to select some of the plurality of page buffers in response to the first decoding signals YBDATA<7:0>. Accordingly, the sense node-invalid signal of a low level is inputted to some of a plurality of the page buffers corresponding to the upper bits AX<13:11> of the column addresses AX<13:0>, and the sense node-invalid signal of a high level is inputted to the remaining page buffers. The masking circuit 160 performs control so that the sense node-invalid signals SO_Yi<7:0> are generated in response to the second decoding signal YCSCPASS<7:0>. The operating speed can be improved because an operation of generating the first decoding signals YBDATA<7:0> and an operation of generating the sense node-invalid signals SO_Yi<7:0> are performed at the same time. That is, the masking circuit 160 may function to perform a cache operation.

In the present embodiment, the first and the second decoders 161 and 162 and the invalid signal generator 163 are illustrated as being included for a cache operation. If a cache operation is not performed, however, the first decoding signals YBDATA<7:0> generated using only the first decoder 161 may be outputted as the sense node-invalid signals SO_Yi<7:0>.

Figure 5:
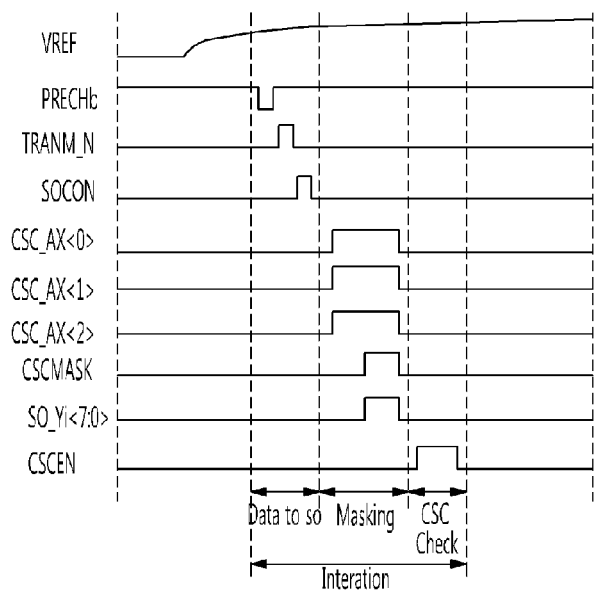
FIG. 5 shows waveforms of signals for illustrating an operation of the nonvolatile memory device according to an embodiment of this disclosure.

FIG. 5 shows waveforms of signals for illustrating an operation of the nonvolatile memory device according to an exemplary embodiment of this disclosure.

Operations of the nonvolatile memory device are described below with reference to FIGS. 1 to 5.

The page buffers PB0 to PBk and RPB of the page buffer unit 150 verify the program state of memory cells belonging to the same pages through the respective bit lines BL0 to BLk and RBL coupled thereto and stores the verified program state. More specifically, after precharging the potential of each of the bit lines BL0 to BLk and RBL to a high level, a verify voltage is supplied to a word line coupled to the memory cells. Thus, the potential of the bit line is maintained or the potential of the bit line is discharged to a low level according to the program state of the memory cells. Here, program data to be programmed into the memory cells is stored in each of the latches of the page buffers PB0 to PBk and RPB. The program data is compared with the potential of the bit line and relevant verify data is stored in the latch.

If, as a result of the comparison, the program operation is determined to be successful because the program data corresponds to the potential of the bit line, the relevant verify data indicates that the potential of the second node QM_N becomes '1', that is, a high level. If, as a result of the comparison, the program operation is determined to be unsuccessful because the program data does not correspond to the potential of the bit line, the relevant verify data indicates that the potential of the second node QM_N becomes '0', that is, a low level.

Next, the potential of the sense node SO is precharged to a high level by using the precharge circuit 152. The first node QM and the sense node SO are coupled by supplying the first transfer signal TRANM_N of a high level. Thus, the potential of the sense node SO is controlled according to the verify data latched in the latch circuit 153. That is, the potential of the sense node SO coupled to a page buffer corresponding to memory cells determined to be successfully programmed is discharged to a low level, and the potential of the sense node SO coupled to a page buffer corresponding to memory cells determined to be unsuccessfully programmed maintains a high level.

The masking circuit 160 generates the sense node-invalid signals SO_Yi<7:0> for selecting some of the plurality of page buffers PB0 to PBk and RPB of the page buffer unit 150 in response to the upper bits AX<13:11> of the column addresses AX<13:0>, the check address signals CSC_AX<2:0>, and the mask signal CSCMASK. The sense node-invalid signals SO_Yi<7:0> is transferred to the plurality of page buffers PB0 to PBk and RPB. That is, the sense node-invalid signals SO_Yi<7:0> are transferred to the page buffers to which the respective upper bits AX<13:11> correspond.

Table 1 illustrates the correspondence between the sense node-invalid signals SO_Yi<7:0> and the upper bits AX<13:11>.

TABLE 1

| Sense node invalid signal | AX<13> | AX<12> | AX<11> | Page 8 KB |
|---|---|---|---|---|
| SO_Yi<0> | 0 | 0 | 0 | $1^{st}$ 1 KB |
| SO_Yi<1> | 0 | 0 | 1 | $2^{nd}$ 1 KB |
| SO_Yi<2> | 0 | 1 | 0 | $3^{rd}$ 1 KB |
| SO_Yi<3> | 0 | 1 | 1 | $4^{th}$ 1 KB |
| SO_Yi<4> | 1 | 0 | 0 | $5^{th}$ 1 KB |
| SO_Yi<5> | 1 | 0 | 1 | $6^{th}$ 1 KB |
| SO_Yi<6> | 1 | 1 | 0 | $7^{th}$ 1 KB |
| SO_Yi<7> | 1 | 1 | 1 | $8^{th}$ 1 KB |

Referring to Table 1, if one page of memory includes 8 KB of memory cells, the page may be defined as eight 1 KB groups. Each one of the eight groups may correspond to a page buffer that further corresponds to an address of the upper bits AX<13:11> that may also correspond to a node-invalid signal SO_Yi<7:0>. For example, the third page buffer group may correspond to an upper address AX<13:11> of '010' which may further correspond to the node-invalid signal of SO_Yi<2>. Furthermore, one page buffer group receives one of the same sense node-invalid signals SO_Yi<7:0>.

The sense node-invalid signal of a low level is supplied to one of the 8 page buffer groups, and the sense node-invalid signal of a high level is supplied to the 7 remaining page buffer groups. Accordingly, the discharge unit 156 of each of the page buffers of a selected page buffer group is turned off in response to the sense node-invalid signal of a low level. Accordingly, a current path flowing through the verify circuit 157 may be formed or cut off according to a potential of the sense node SO where the sense node SO may be controlled based on verify data.

In contrast, in the remaining page buffer groups other than the selected page buffer group, the potential of the sense node SO is charged to a low level in response to the sense node-invalid signal of a high level irrespective of the program state of the memory cells. Thus, a current path flowing through the verify circuit 157 is not formed.

That is, only a current path according to a fail memory cell within the selected page buffer group is formed.

The pass/fail circuit 170 generates the pass or fail signal PASS or FAIL by comparing the amount of measured current, flowing through the current path according to the fail memory cell within the selected page buffer group, with the amount of reference current corresponding to the number of permitted bits that may be processed by the ECC circuit. For example, if the amount of measured current is greater than the amount of reference current, the pass/fail circuit 170 may generate the fail signal FAIL. If the amount of measured current is smaller than the amount of reference current, the pass/fail circuit 170 may generate the pass signal PASS.

After the pass/fail check operation on the selected page buffer group is finished, a next page buffer group corresponding to a next column address is selected, and the pass/fail check operation is performed on the next page buffer group. That is, the pass/fail check operation is performed by sequentially selecting the 8 page buffer groups.

As described above, in accordance with this disclosure, when a pass/fail check operation is performed on memory cells, the pass/fail check operation is performed on only page buffers with column addresses having the same upper bits, by controlling the discharge circuits within the respective page buffers using the upper bits of the column addresses. Accordingly, the pass/fail check operation can be performed on a column address unit that may be processed by the ECC circuit.

Furthermore, in a pass/fail check operation, the number of page buffers that may be selected at once in response to a column address can be easily controlled.

What is claimed is:

1. A nonvolatile memory device, comprising:
 a page buffer unit configured to comprise a plurality of page buffers coupled to respective bit lines;
 a pass/fail circuit coupled to the page buffer unit and configured to perform a pass/fail check operation by comparing an amount of current, varying according to verify data stored in the plurality of page buffers, with an amount of reference current corresponding to a number of allowed error correction code bits; and
 a masking circuit configured to preclude the pass/fail check operation by coupling a ground terminal to sense nodes coupled to the remaining page buffers, respectively, other than page buffers corresponding to column addresses having identical upper bits as an input column address.

2. The nonvolatile memory device of claim 1, wherein each of the plurality of page buffers temporarily stores the verify data by sensing a program state of memory cells comprising the page buffer and controls a potential of a sense node based on the verify data.

3. The nonvolatile memory device of claim 2, wherein each of the plurality of page buffers comprises:
 a line coupling circuit for coupling a respective bit line and the sense node;
 a precharge circuit for precharging the sense node;

a latch circuit for temporarily storing the verify data by sensing the potential of the sense node and controlling the potential of the sense node based on the stored verify data;

a discharge circuit for discharging the potential of the sense node to a low level in response to one of sense node-invalid signals; and a verify circuit for forming a path of current flowing from a verify terminal to the ground terminal based on the potential of the sense node.

4. The nonvolatile memory device of claim 3, wherein each of remaining page buffers other than selected page buffers has an amount of current equal to 0 which flows through the verify circuit.

5. The nonvolatile memory device of claim 1, wherein the masking circuit comprises:
a first decoder for generating first decoding signals by decoding the upper bits of the column addresses;
a second decoder for generating second decoding signals by decoding check address signals in response to a mask signal; and
an invalid signal generator for generating sense node-invalid signals in response to the first and the second decoding signals.

6. The nonvolatile memory device of claim 5, wherein:
the invalid signal generator comprises a plurality of signal generators, and
each of the signal generators comprises:
a control circuit for generating a control signal in response to one of the first decoding signals; and
a determination circuit for generating one of the sense node-invalid signals in response to the control signal and one of the second decoding signals.

7. The nonvolatile memory device of claim 5, wherein a number of upper bits comprising a column address is identical with a number of check address signals.

8. The nonvolatile memory device of claim 5, wherein the sense nodes of unselected page buffers, from among the plurality of page buffers, are discharged in response to the sense node-invalid signals.

9. The nonvolatile memory device of claim 1, wherein page buffers having column addresses having identical upper bits, from among the plurality of page buffers, identifies a page buffer group from among a plurality of page buffer groups.

10. A nonvolatile memory device, comprising:
a memory block configured to comprise a plurality of memory cells;
a page buffer unit configured to comprise a plurality of page buffers coupled to respective bit lines of the memory block, to temporarily store verify data by sensing a program state of the memory cells corresponding to the plurality of page buffers, and to control a potential of each of the sense nodes based on the verify data;
a masking circuit configured to sequentially generate sense node-invalid signals in order to define page buffers corresponding to column addresses having identical upper bits and select the page buffers by group; and
a pass/fail circuit configured to generate a pass or fail signal by comparing an amount of current flowing through verify circuits, included in the respective page buffers corresponding to the column addresses having the identical upper bits, with an amount of reference current corresponding to a number of allowed error correction code bits.

11. The nonvolatile memory device of claim 10, wherein the masking circuit sequentially generates the sense node-invalid signals in response to the upper bits of the column addresses.

12. The nonvolatile memory device of claim 11, wherein the amount of current exists in the verify circuits in remaining page buffers other than page buffers selected in response to one of the sense node-invalid signals, from among the plurality of page buffers.

13. The nonvolatile memory device of claim 10, wherein each of the plurality of page buffers comprises:
a line coupling circuit for coupling a respective bit line and the sense node;
a precharge circuit for precharging the sense node;
a latch circuit for temporarily storing the verify data by sensing the potential of the sense node and controlling the potential of the sense node based on the stored verify data;
a discharge circuit for discharging the potential of the sense node to a low level in response to one of sense node-invalid signals; and
a verify circuit for forming a path of current flowing from a verify terminal to the ground terminal based on the potential of the sense node.

14. The nonvolatile memory device of claim 10, wherein the masking circuit comprises:
a first decoder for generating first decoding signals by decoding the upper bits of the column addresses;
a second decoder for generating second decoding signals by decoding check address signals in response to a mask signal; and
an invalid signal generator for generating sense node-invalid signals in response to the first and the second decoding signals.

15. The nonvolatile memory device of claim 14, wherein:
the invalid signal generator comprises a plurality of signal generators, and
each of the signal generators comprises:
a control circuit for generating a control signal in response to one of the first decoding signals; and
a determination circuit for generating one of the sense node-invalid signals in response to the control signal and one of the second decoding signals.

16. The nonvolatile memory device of claim 14, wherein a number of upper bits comprising a column address is identical with a number of check address signals.

17. The nonvolatile memory device of claim 10, wherein:
page buffers having column addresses having identical upper bits, from among the plurality of page buffers, identifies a page buffer group from among a plurality of page buffer groups, and
the plurality of page buffer groups is sequentially selected in response to the sense node-invalid signals which are sequentially enabled.

18. The nonvolatile memory device of claim 10, wherein the sense nodes of unselected page buffers of the plurality of page buffers are discharged to a low level in response to the sense node-invalid signals.

19. A method of operating a nonvolatile memory device, comprising:
verifying a program state of a plurality of memory cells included in identical pages of a memory block by using a plurality of page buffers corresponding to the plurality of memory cells;
controlling a potential of each of sense nodes included in the respective page buffers based on a result of the verification;

selecting page buffers corresponding to column addresses having identical upper bits, from among the plurality of page buffers; and generating a pass or fail signal by comparing an amount of current according to a result of the verification of the selected page buffers with an amount of reference current.

20. The method of claim 19, wherein selecting page buffers corresponding to column addresses having identical upper bits comprises:

generating first decoding signals by decoding the upper bits of the column addresses;

generating second decoding signals by decoding check address signals having an identical number of bits as a number of upper bits; and generating sense node-invalid signals for selecting the page buffers, having the identical upper bits, in response to the first and the second decoding signals; and selecting the page buffers having the identical upper bits in response to the sense node-invalid signals.

21. The method of claim 19, wherein page buffers having column addresses having an identical upper bit, from among the plurality of page buffers, form each of a plurality of page buffer groups.

22. The method of claim 21, further comprising:

selecting one of unselected page buffer groups from the plurality of page buffer groups, after generating the pass or fail signal; and generating the pass or fail signal by comparing an amount of current according to a result of the verification for the selected page buffer group with an amount of reference current.

* * * * *